(12) United States Patent
Choi et al.

(10) Patent No.: US 12,127,448 B2
(45) Date of Patent: Oct. 22, 2024

(54) DISPLAY DEVICE

(71) Applicant: Samsung Display Co., Ltd., Yongin-Si (KR)

(72) Inventors: Junwon Choi, Seoul (KR); Jaewon Kim, Hwaseong-si (KR); Junyoung Min, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 364 days.

(21) Appl. No.: 17/506,043

(22) Filed: Oct. 20, 2021

(65) Prior Publication Data

US 2022/0181421 A1 Jun. 9, 2022

(30) Foreign Application Priority Data

Dec. 7, 2020 (KR) .......................... 10-2020-0169759

(51) Int. Cl.
*H10K 59/126* (2023.01)
*G09G 3/3233* (2016.01)
*H10K 59/131* (2023.01)

(52) U.S. Cl.
CPC ......... *H10K 59/126* (2023.02); *G09G 3/3233* (2013.01); *H10K 59/131* (2023.02); *G09G 2300/0842* (2013.01)

(58) Field of Classification Search
CPC ......... H10K 59/126131; G09G 3/3233; G09G 2300/0842; G09G 2300/0819; G09G 3/3225; G09G 2330/00; H05B 45/00; H05B 45/30; H05B 44/00
See application file for complete search history.

(56) References Cited

U.S. PATENT DOCUMENTS 11,302,265 B2  4/2022  Lee
2018/0226459 A1* 8/2018 Bae ..................... H10K 59/13

FOREIGN PATENT DOCUMENTS

| KR | 1020170028464 A | 3/2017 |
| KR | 1020200016425 A | 2/2020 |
| KR | 1020200087924 A | 7/2020 |

* cited by examiner

*Primary Examiner* — Anne M Hines
*Assistant Examiner* — Jose M Diaz
(74) *Attorney, Agent, or Firm* — CANTOR COLBURN LLP

(57) ABSTRACT

A display device includes: pixel circuits defining pixel circuit rows each extending in a first direction and pixel circuit columns each extending in a second direction crossing the first direction; active patterns disposed to correspond to the pixel circuits, respectively; a horizontal diode initialization voltage line which transmits a diode initialization voltage and extends in the first direction; and a vertical diode initialization voltage line extending in the second direction and connected to the horizontal diode initialization voltage line. Each of the active patterns includes first and second diode initialization active regions to which the diode initialization voltage is applied. First active patterns of the plurality of the active patterns corresponding to one of the pixel circuit rows are connected to each other. A first end of one of the first and second diode initialization active regions contact the vertical diode initialization voltage line.

22 Claims, 10 Drawing Sheets

DISPLAY DEVICE

This application claims priority to Korean Patent Application No. 10-2020-0169759 filed on Dec. 7, 2020, and all the benefits accruing therefrom under 35 U.S.C. § 119, the content of which in its entirety is herein incorporated by reference.

BACKGROUND

1. Field

Embodiments relate to a display device. More particularly, embodiments relate to an organic light emitting display device.

2. Description of the Related Art

A display device may include a plurality of pixels that emit light for displaying an image. Each of the pixels may include a plurality of transistors for generating a driving current and a light emitting element that emits light based on the driving current.

The transistors of each of the pixels may include an active pattern including a semiconductor material. When the active patterns are electrically separated from each other, the active patterns may be damaged by static electricity introduced in the process of manufacturing or using the display device.

SUMMARY

Embodiments provide a display device having an improved display quality.

A display device according to an embodiment includes: a plurality of pixel circuits defining a plurality of pixel circuit rows each extending in a first direction and a plurality of pixel circuit columns each extending in a second direction crossing the first direction; a plurality of active patterns disposed to correspond to the plurality of pixel circuits, respectively; a horizontal diode initialization voltage line which transmits a diode initialization voltage and extends in the first direction; and a vertical diode initialization voltage line extending in the second direction and connected to the horizontal diode initialization voltage line. Each of the plurality of active patterns include first and second diode initialization active regions to which the diode initialization voltage is applied. First active patterns of the plurality of active patterns corresponding to one of the plurality of pixel circuit rows are connected to each other. A first end of one of the first and second diode initialization active regions contact the vertical diode initialization voltage line.

In an embodiment, a first end of another one of the first and second diode initialization active regions may contact a connection pattern contacting the horizontal diode initialization voltage line.

In an embodiment, a second end of the first diode initialization active region and a second end of the second diode initialization active region may be connected to an anode electrode of a light emitting diode.

In an embodiment, second active patterns of the plurality of active patterns corresponding to one of the plurality of pixel circuit columns may be separated from each other.

In an embodiment, a first end of a second diode initialization active region of an active pattern in an M-th pixel circuit column may contacts the vertical diode initialization voltage line, where M is a natural number. A first end of a first diode initialization active region of the active pattern in the M-th pixel circuit column may contact a first connection pattern contacting the horizontal diode initialization voltage line.

In an embodiment, a first end of a first diode initialization active region of an active pattern in an (M+1)-th pixel circuit column may contact the vertical diode initialization voltage line.

In an embodiment, a first end of a second diode initialization active region of the active pattern in the (M+1)-th pixel circuit column may contact a second connection pattern contacting the horizontal diode initialization voltage line.

In an embodiment, each of the plurality of active patterns may further include a driving initialization active region to which a driving initialization voltage is applied. A first diode initialization active region and a second diode initialization active region of an active pattern in an N-th pixel circuit row and an M-th pixel circuit column may be disposed with a driving initialization active region of an active pattern in an (N+1)-th pixel circuit row and the M-th pixel circuit column interposed therebetween in a plan view, where M and N are natural numbers.

In an embodiment, the display device may further include a plurality of initialization control lines each extending in the first direction and disposed to correspond to a corresponding pixel circuit row of the plurality of pixel circuit rows. An initialization control line in the (N+1)-th pixel row may overlap the driving initialization active region of the active pattern in the (N+1)-th pixel circuit row and the M-th pixel circuit column and the first and second diode initialization active regions of the active pattern in the N-th pixel circuit row and the M-th pixel circuit column in the plan view.

In an embodiment, the driving initialization active region of the active pattern in the (N+1)-th pixel circuit row and the M-th pixel circuit column may be disposed in the first direction from the first diode initialization active region of the active pattern in the N-th pixel circuit row and the M-th pixel circuit column. The second diode initialization active region of the active pattern in the N-th pixel circuit row and the M-th pixel circuit column may be disposed in the first direction from the driving initialization active region of the active pattern in the (N+1)-th pixel circuit row and the M-th pixel circuit column.

A display device according to an embodiment includes: a first pixel circuit; a second pixel circuit disposed in a first direction from the first pixel circuit; a third pixel circuit disposed in a second direction from the first pixel circuit, where the second direction crosses the first direction; first to third active patterns disposed to correspond to the first to third pixel circuits, respectively; a horizontal diode initialization voltage line which transmits a diode initialization voltage and extends in the first direction; and a vertical diode initialization voltage line extending in the second direction and connected to the horizontal diode initialization voltage line. Each of the first to third active patterns may include first and second diode initialization active regions to which the diode initialization voltage is applied. The first active pattern and the second active pattern are connected to each other. A first end of one of the first and second diode initialization active regions may contact the vertical diode initialization voltage line.

In an embodiment, a first end of another one of the first and second diode initialization active regions may contact a connection pattern contacting the horizontal diode initialization voltage line.

In an embodiment, a second end of the first diode initialization active region and a second end of the second diode initialization active region may be connected to an anode electrode of a light emitting diode.

In an embodiment, wherein the first active pattern and the third active pattern may be separated from each other.

In an embodiment, a first end of the second diode initialization active region of the first active pattern may contact the vertical diode initialization voltage line. A first end of the first diode initialization active region of the first active pattern may contact a first connection pattern contacting the horizontal diode initialization voltage line.

In an embodiment, a first end of the first diode initialization active region of the second active pattern may contact the vertical diode initialization voltage line.

In an embodiment, a first end of the second diode initialization active region of the second active pattern may contact a second connection pattern contacting the horizontal diode initialization voltage line.

In an embodiment, each of the first to third active patterns may further include a driving initialization active region to which a driving initialization voltage is applied. The first diode initialization active region and the second diode initialization active region of the first active pattern may be disposed with the driving initialization active region of the third active pattern interposed therebetween in a plan view.

A display device according to an embodiment includes: a first pixel circuit; a second pixel circuit disposed in a first direction from the first pixel circuit; and a third pixel circuit disposed in a second direction from the first pixel circuit, where the second direction crosses the first direction. Each of the first to third pixel circuits may include an active pattern including a driving initialization active region to which a driving initialization voltage is applied and first and second diode initialization active regions to which a diode initialization voltage different from the driving initialization voltage is applied and an initialization control line disposed on the active pattern and extending in the first direction. The first diode initialization active region and the second diode initialization active region of the active pattern of the first pixel circuit may be disposed with the driving initialization active region of the active pattern of the third pixel circuit interposed therebetween in a plan view.

In an embodiment, the driving initialization active region of the active pattern may form a driving initialization transistor together with the initialization control line. The first diode initialization active region of the active pattern may form a first diode initialization transistor together with the initialization control line. The second diode initialization active region of the active pattern may form a second diode initialization transistor together with the initialization control line.

In an embodiment, each of the first to third pixel circuits may further include a driving transistor which provides a driving current to a light emitting diode. The driving initialization transistor may provide the driving initialization voltage to the driving transistor.

In an embodiment, wherein each of the first diode initialization transistor and the second diode initialization transistor may provide the diode initialization voltage to the light emitting diode.

In the display device according to the embodiments, although static electricity is introduced in the process of manufacturing or using the display device, the active patterns disposed in one pixel circuit row may be connected to each other, so that the static electricity may be dispersed and the active patterns may not be damaged. Accordingly, the display quality of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Hereinafter, display devices in accordance with embodiments will be explained in detail with reference to the accompanying drawings.

Figure 1:
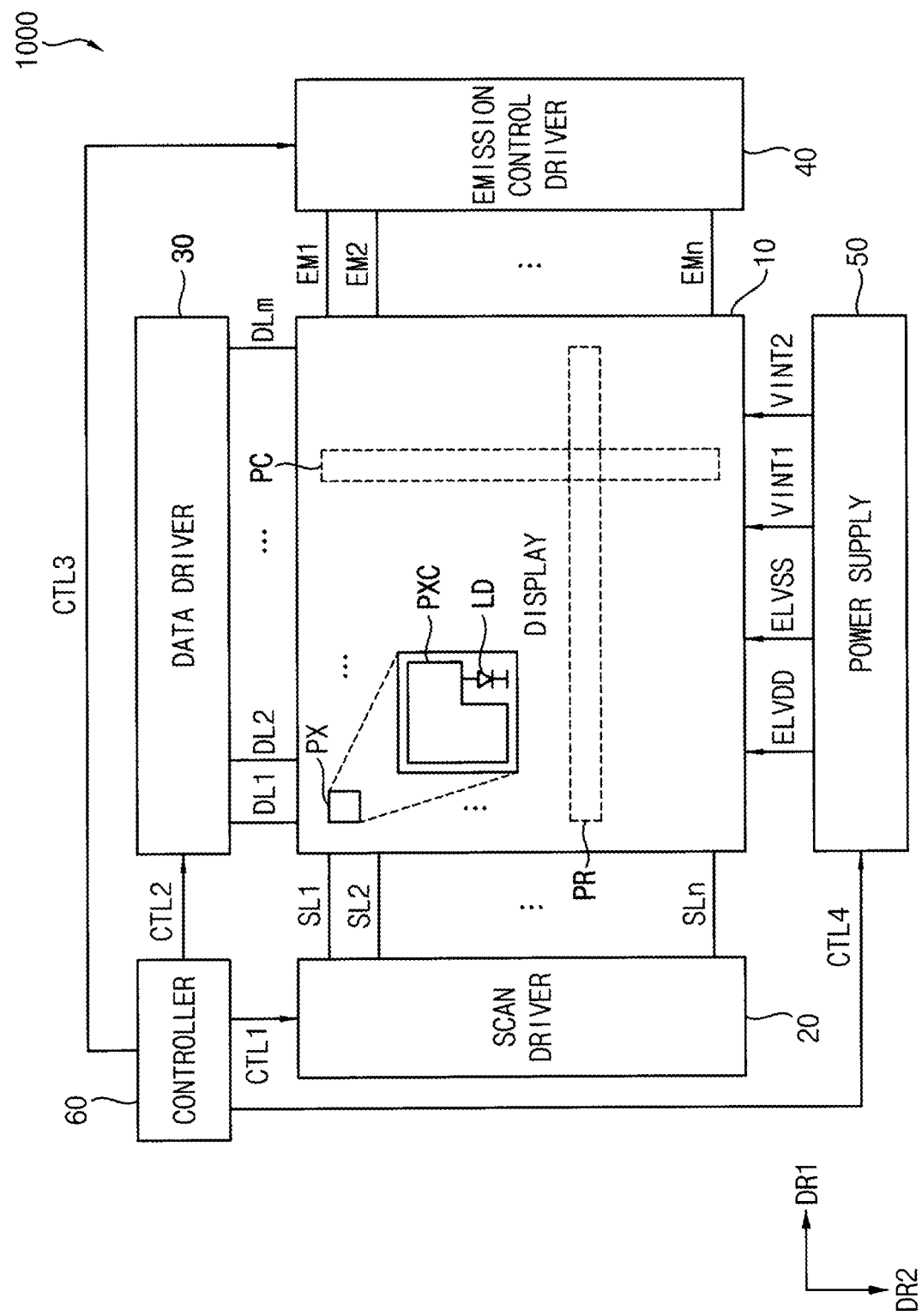
FIG. 1 is a block diagram illustrating a display device according to an embodiment.

FIG. 1 is a block diagram illustrating a display device according to an embodiment.

Referring to FIG. 1, a display device 1000 may include a display (display unit or display panel) 10, a scan driver 20, a data driver 30, an emission control driver 40, a power supply 50, and a controller 60.

The display 10 may include a plurality of pixels PX, a plurality of scan lines SL1 to SLn, a plurality of data lines DL1 to DLm, and a plurality of emission control lines EM1 to EMn. Here, m and n are natural numbers. Each of the pixels PX may include a pixel circuit PXC and a light emitting diode LD. The pixel circuits PXC may be arranged along a first direction DR1 and a second direction DR2 crossing the first direction DR1. For example, the first direction DR1 may be a row direction, and the second direction DR2 may be a column direction. In this case, the pixel circuits PXC may define a plurality of pixel circuit rows PR extending in the first direction DR1 and arranged along the second direction DR2, and a plurality of pixel circuit columns PC extending in the second direction DR2 and arranged along the first direction DR1. The pixel circuit rows PR may be a group of the pixel circuits PXC in the same row, and the pixel circuit rows PC may be a group of the pixel circuits PXC in the same column.

The scan lines SL1 to SLn may extend in the first direction DR1, and may be arranged along the second direction DR2. The data lines DL1 to DLm may extend in the second direction DR2, and may be arranged along the first direction DR1. The emission control lines EM1 to EMn may extend in the first direction DR1, and may be arranged along the second direction DR2.

The scan driver 20 may provide a scan signal to the pixels PX through the scan lines SL1 to SLn based on a first control signal CTL1.

The data driver 30 may provide a data signal to the pixels PX through the data lines DL1 to DLm based on a second control signal CTL2.

The emission control driver 40 may provide an emission control signal to the pixels PX through the emission control lines EM1 to EMn based on a third control signal CTL3.

The power supply 50 may provide voltages, such as a first power voltage ELVDD, a second power voltage ELVSS, a driving initialization voltage VINT1, and a diode initialization voltage VINT2, or the like, to the pixels PX based on a fourth control signal CTL4. In an embodiment, a voltage level of the second power voltage ELVSS may be lower than a voltage level of the first power voltage ELVDD. In an embodiment, each of the driving initialization voltage VINT1 and the diode initialization voltage VINT2 may have a voltage level between the voltage level of the first power voltage ELVDD and the voltage level of the second power voltage ELVSS. For example, the voltage level of the driving initialization voltage VINT1 may be higher than the voltage level of the diode initialization voltage VINT2.

The controller 60 may control the scan driver 20, the data driver 30, the emission control driver 40, and the power supply 50. The controller 60 may provide the first control signal CTL1 to the scan driver 20 to control the scan driver 20. The controller 60 may provide the second control signal CTL2 to the data driver 30 to control the data driver 30. The controller 60 may provide the third control signal CTL3 to the emission control driver 40 to control the emission control driver 40. The controller 60 may provide the fourth control signal CTL4 to the power supply 50 to control the power supply 50.

Figure 2:
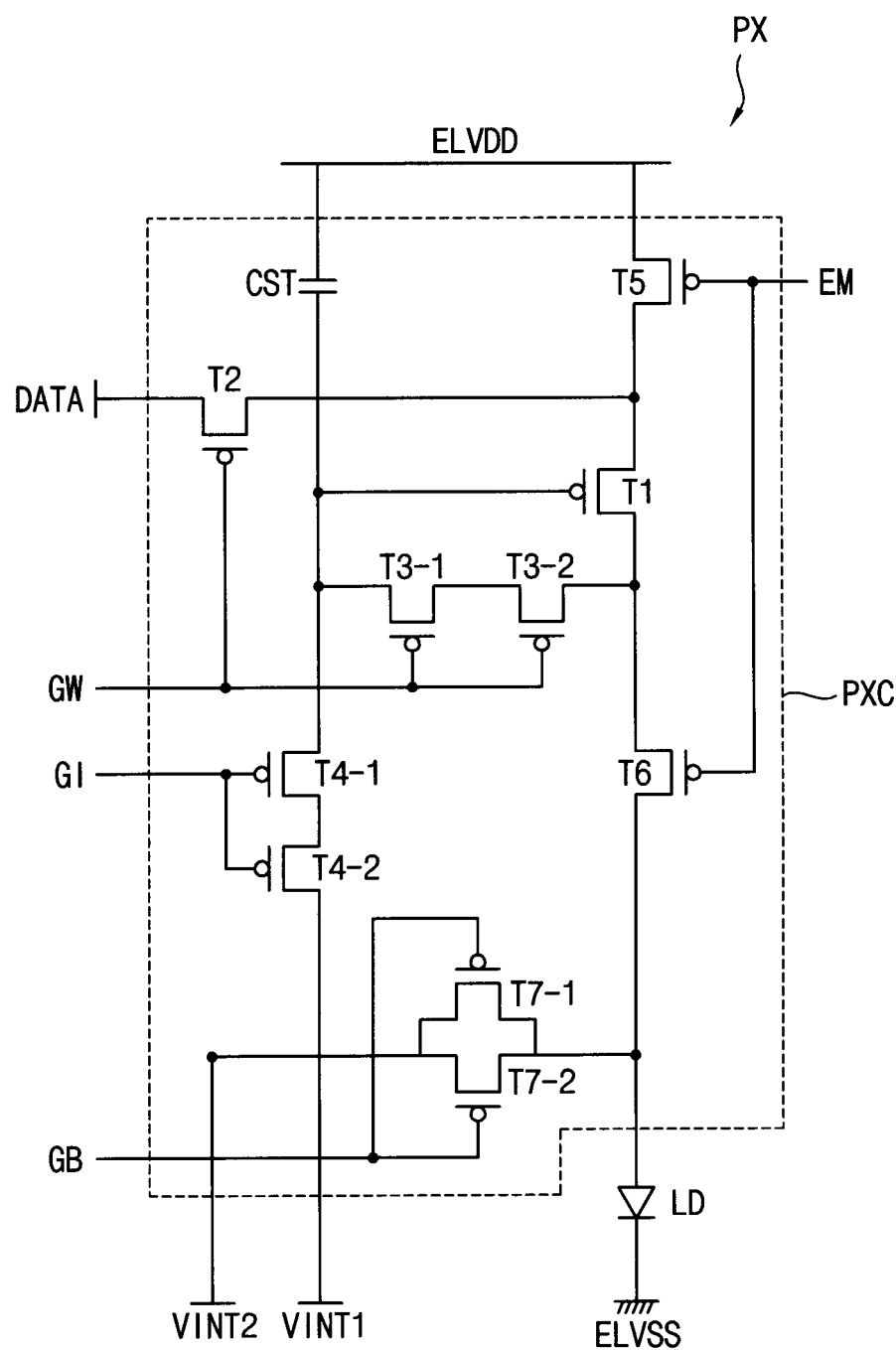
FIG. 2 is a circuit diagram illustrating a pixel included in the display device in FIG. 1.

FIG. 2 is a circuit diagram illustrating the pixel PX included in the display device 1000 in FIG. 1.

Referring to FIG. 2, the pixel PX may include a pixel circuit PXC and a light emitting diode LD. The pixel circuit PXC may include a plurality of transistors T1, T2, T3-1, T3-2, T4-1, T4-2, T5, T6, T7-1, and T7-2 and a storage capacitor CST. Transistors T1, T2, T3-1, T3-2, T4-1, T4-2, T5, T6, T7-1, and T7-2 may include a first transistor T1, a second transistor T2, a third transistor T3-1 and T3-2, a fourth transistor T4-1 and T4-2, a fifth transistor T5, a sixth transistor T6, and a seventh transistor T7-1 and T7-2.

The first transistor T1 may be electrically connected to a line supplying the first power voltage ELVDD via the fifth transistor T5 and a first electrode of the light emitting diode LD via the sixth transistor T6, and may provide a driving current corresponding to a data signal DATA to the light emitting diode LD. In other words, the first transistor T1 may be a driving transistor.

The second transistor T2 may be connected between a data line supplying the data signal DATA and a first electrode of the first transistor T1, and may transmit the data signal DATA to the first transistor T1 in response to a scan signal GW. In other words, the second transistor T2 may be a switching transistor.

The third transistor T3-1 and T3-2 may be connected between a gate electrode of the first transistor T1 and a second electrode of the first transistor T1, and may diode-connect the first transistor T1 in response to the scan signal GW thereby compensating a threshold voltage of the first transistor T1. In other words, the third transistor T3-1 and T3-2 may be a compensation transistor.

In an embodiment, the third transistor T3-1 and T3-2 may include a first compensation transistor T3-1 and a second compensation transistor T3-2. The first compensation transistor T3-1 and the second compensation transistor T3-2 may be connected in series with each other. In other words, a gate electrode of the first compensation transistor T3-1 and a gate electrode of the second compensation transistor T3-2 may be connected to each other, and a second electrode of the first compensation transistor T3-1 and a first electrode of the second compensation transistor T3-2 may be connected to each other.

The fourth transistor T4-1 and T4-2 may be connected between a line supplying the driving initialization voltage VINT1 and the gate electrode of the first transistor T1, and may provide the driving initialization voltage VINT' to the gate electrode of the first transistor T1 in response to a first initialization control signal GI. In other words, the fourth transistor T4-1 and T4-2 may be a driving initialization transistor.

In an embodiment, the fourth transistor T4-1 and T4-2 may include a first driving initialization transistor T4-1 and a second driving initialization transistor T4-2. The first driving initialization transistor T4-1 and the second driving initialization transistor T4-2 may be connected in series with each other. In other words, a gate electrode of the first driving initialization transistor T4-1 and a gate electrode of the second driving initialization transistor T4-2 may be connected to each other, and a second electrode of the first driving initialization transistor T4-1 and a first electrode of the second driving initialization transistor T4-2 may be connected to each other.

The fifth transistor T5 may be connected between the line supplying the first power voltage ELVDD and the first electrode of the first transistor T1, and the sixth transistor T6 may be connected between the second electrode of the first transistor T1 and the first electrode of the light emitting diode LD. Each of the fifth transistor T5 and the sixth transistor T6 may provide the driving current corresponding to the data signal DATA to the first electrode of the light emitting diode LD in response to an emission control signal EM. In other words, each of the fifth transistor T5 and the sixth transistor T6 may be an emission control transistor.

The seventh transistor T7-1 and T7-2 may be connected between the diode initialization voltage VINT2 and the first electrode of the light emitting diode LD, and may provide the diode initialization voltage VINT2 to the first electrode of the light emitting diode LD in response to a second initialization control signal GB. In other words, the seventh transistor T7-1 and T7-2 may be a diode initialization transistor.

The seventh transistor T7-1 and T7-2 may include a first diode initialization transistor T7-1 and a second diode initialization transistor T7-2. The first diode initialization transistor T7-1 and the second diode initialization transistor T7-2 may be connected in parallel with each other. In other words, a gate electrode of the first diode initialization transistor T7-1 and a gate electrode of the second diode initialization transistor T7-2 may be connected to each other, a first electrode of the first diode initialization transistor T7-1 and a first electrode of the second diode initialization transistor T7-2 may be connected to each other, and a second electrode of the first diode initialization transistor T7-1 and a second electrode of the second diode initialization transistor T7-2 may be connected to each other.

Figure 3:
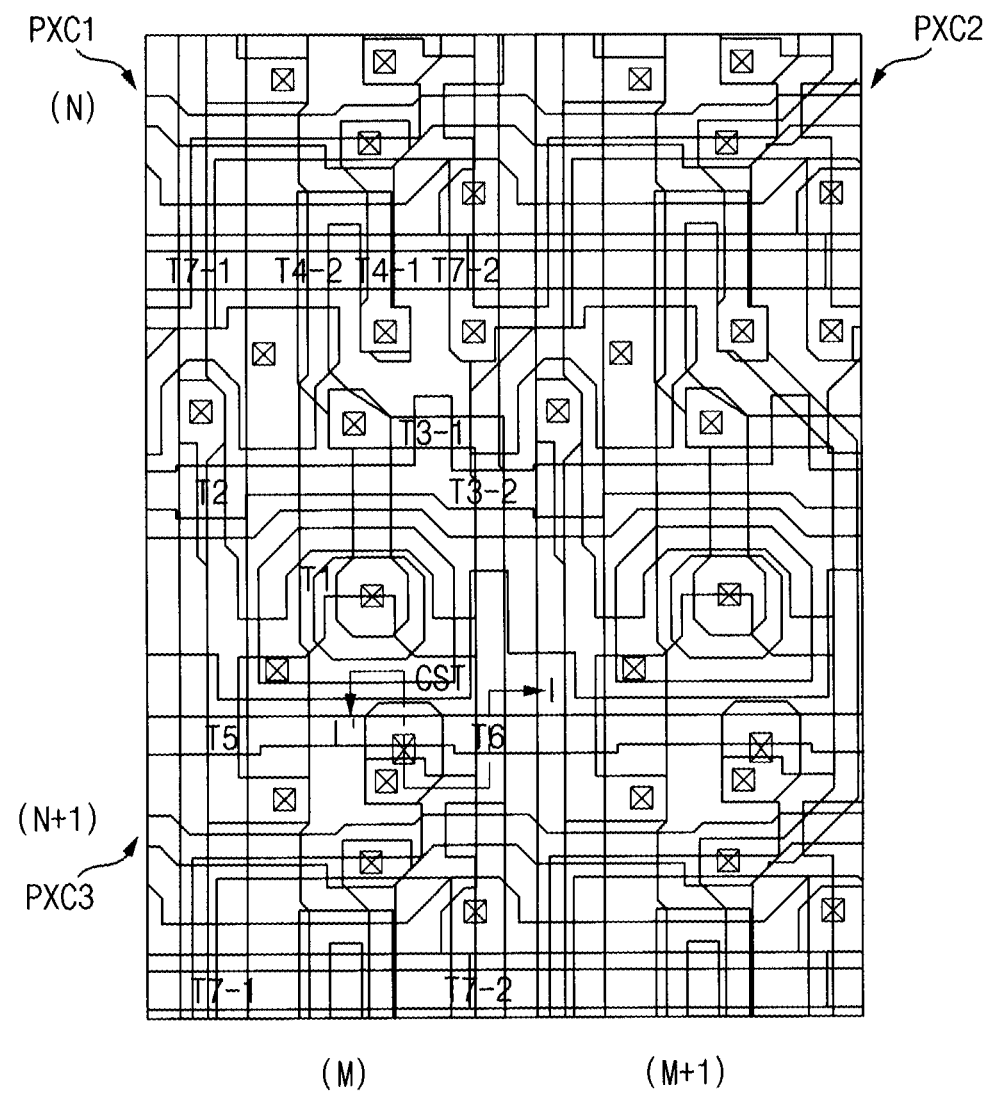
FIG. 3 is a layout view illustrating pixel circuits included in the display device in FIG. 1.

FIG. 3 is a layout view illustrating the pixel circuits PXC included in the display device 1000 in FIG. 1.

Referring to FIGS. 1 and 3, the pixel circuits PXC may include first to third pixel circuits PXC1, PXC2, and PXC3. The second pixel circuit PXC2 may be disposed in the first direction DR1 from the first pixel circuit PXC1, and the third pixel circuit PXC3 may be disposed in the second direction DR2 from the first pixel circuit PXC1. In other words, when the first pixel circuit PXC1 is disposed in an N-th pixel circuit row and an M-th pixel circuit column, where M and N are natural numbers, the second pixel circuit PXC2 may be disposed in the N-th pixel circuit row and an (M+1)-th pixel circuit column, and the third pixel circuit PXC3 may be disposed in an (N+1)-th pixel circuit row and the M-th pixel circuit column.

Each of the first pixel circuit PXC1, the second pixel circuit PXC2, and the third pixel circuit PXC3 may include the transistors T1, T2, T3-1, T3-2, T4-1, T4-2, T5, T6, T7-1, and T7-2 and the storage capacitor CST.

Figure 4:
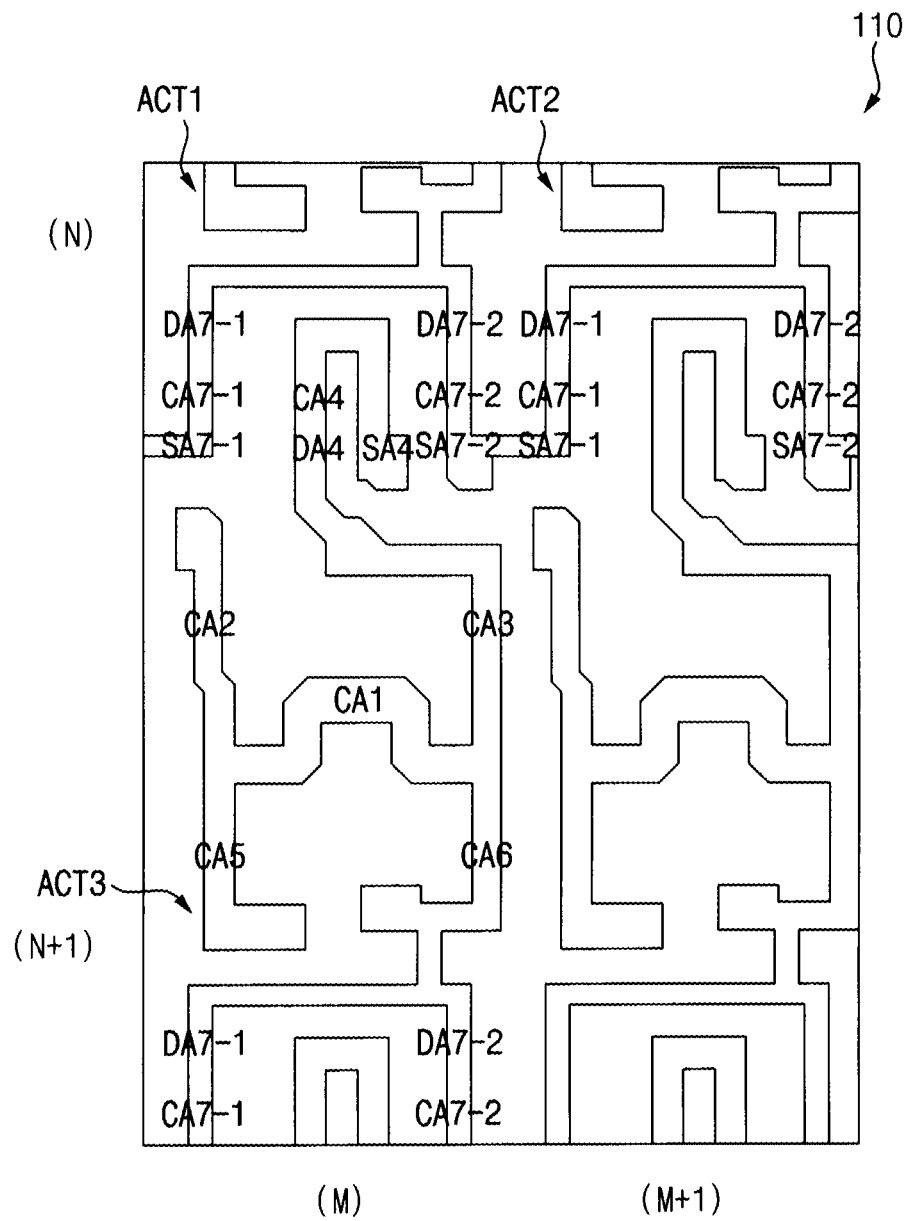
FIG. 4 is a plan view illustrating an active layer of the display device in FIG. 3.
Figure 5:
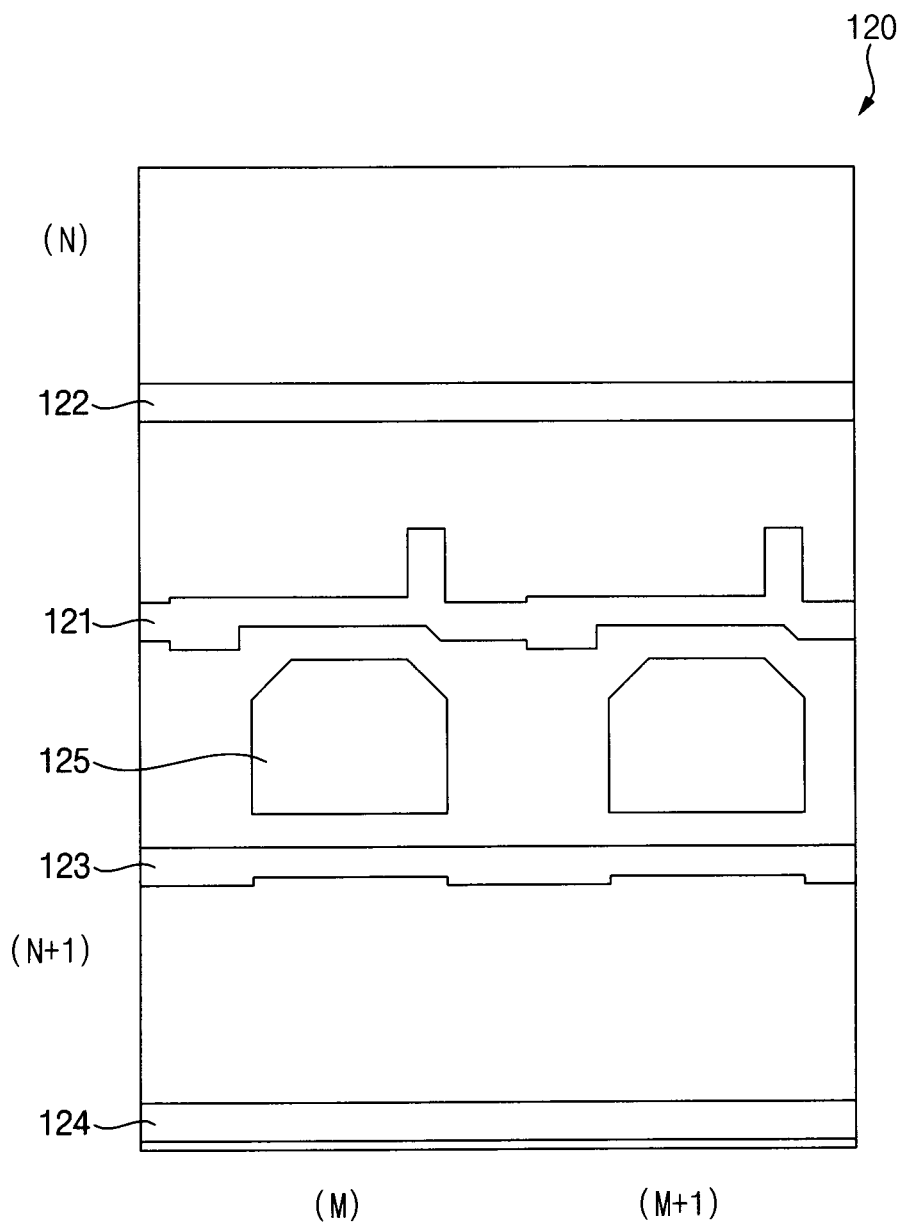
FIG. 5 is a plan view illustrating a first gate layer of the display device in FIG. 3.
Figure 6:
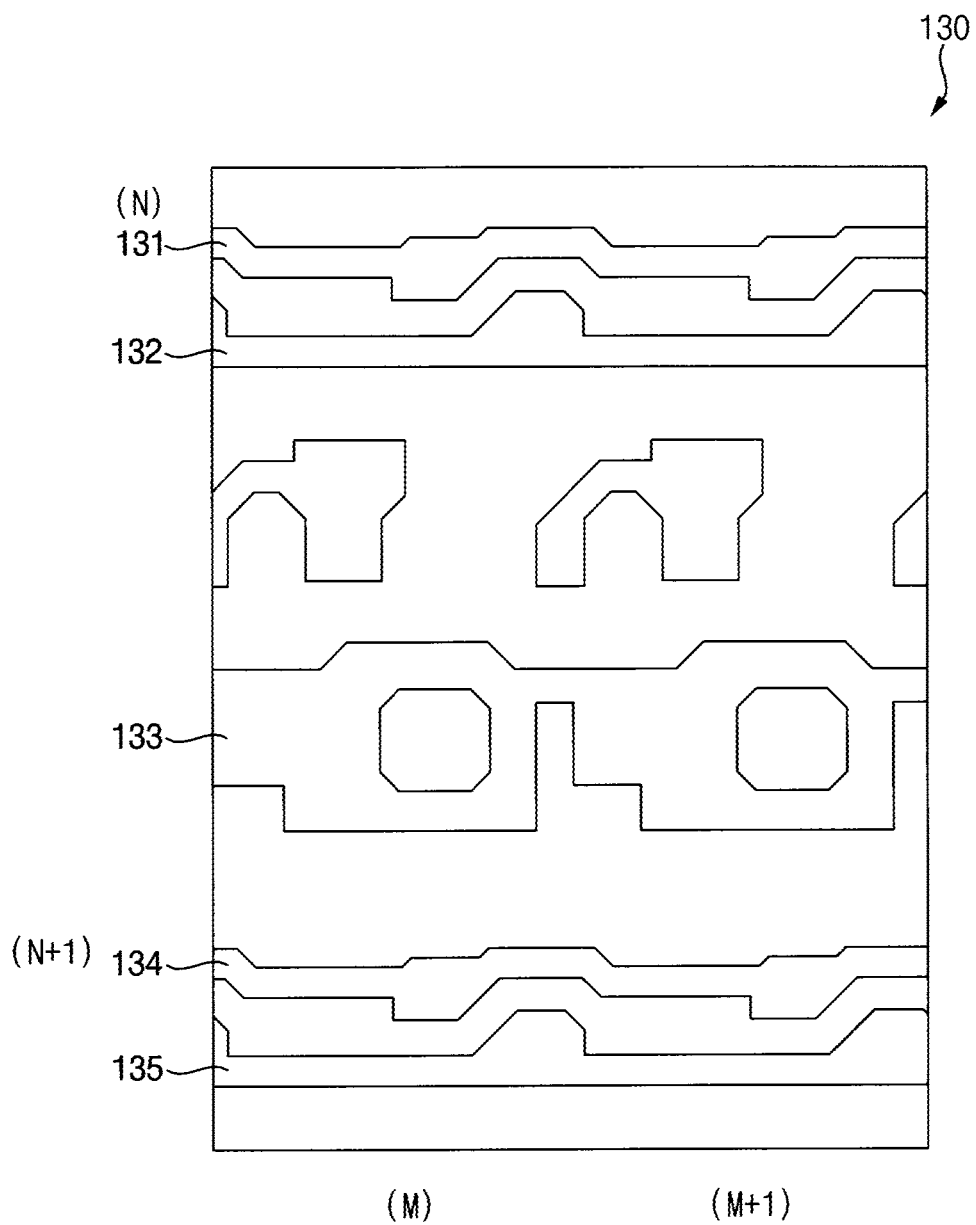
FIG. 6 is a plan view illustrating a second gate layer of the display device in FIG. 3.
Figure 7:
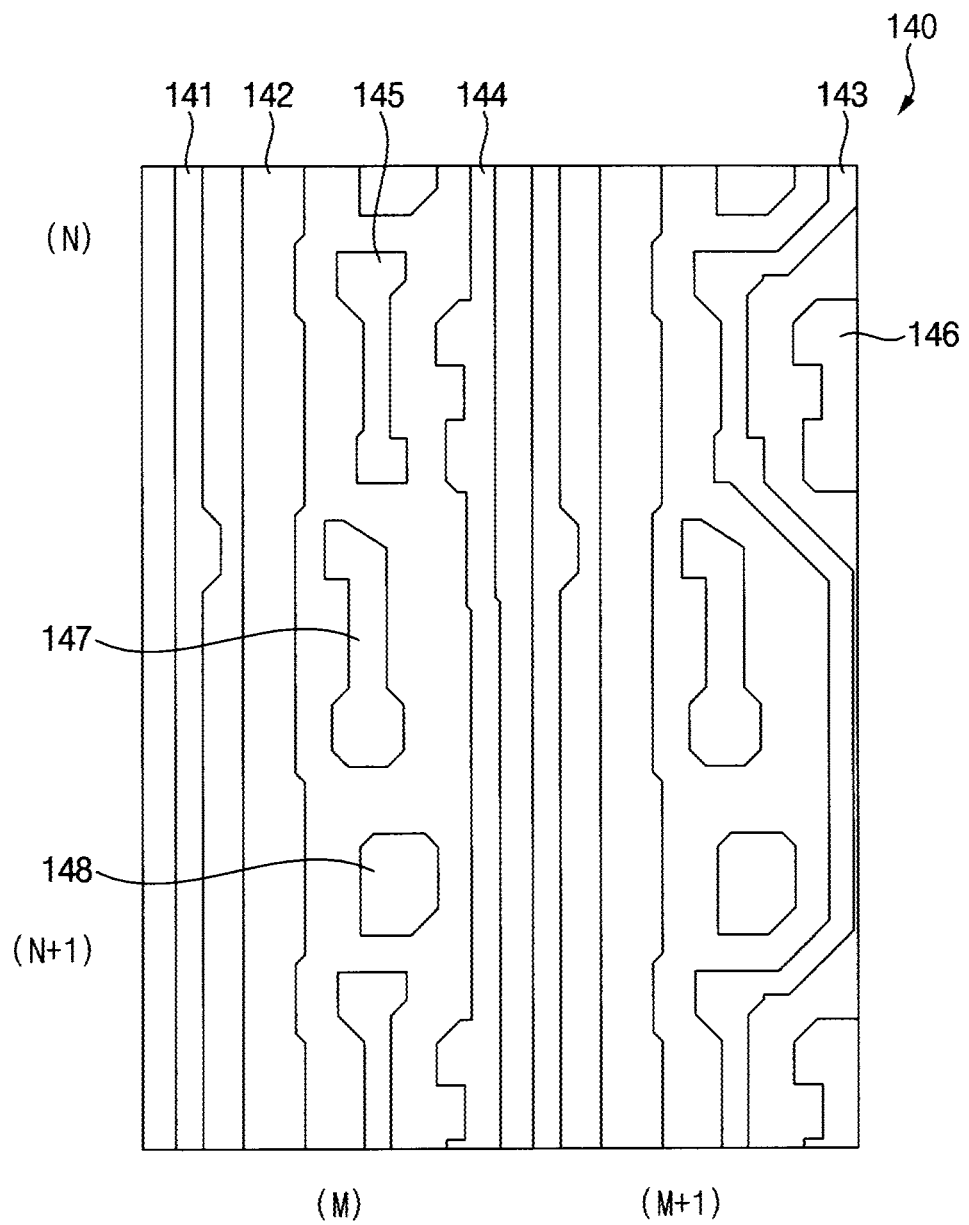
FIG. 7 is a plan view illustrating a conductive layer of the display device in FIG. 3.
Figure 8:
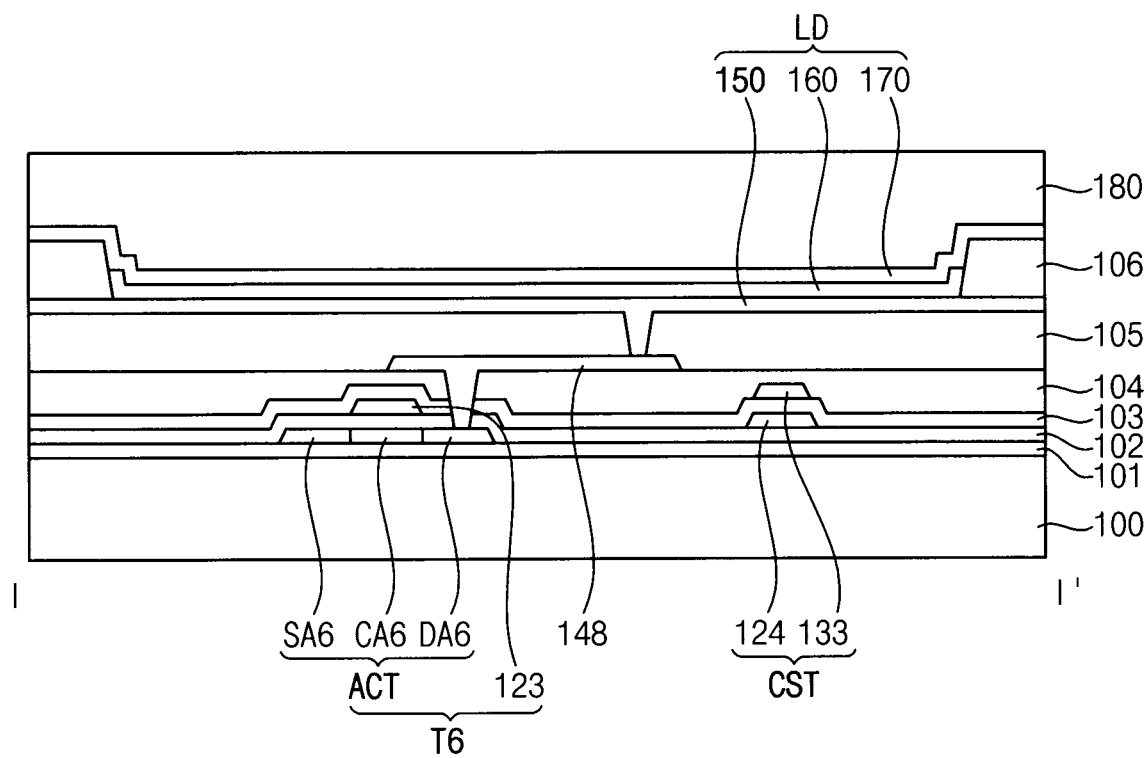
FIG. 8 is a cross-sectional view illustrating the display device taken along line I-I' in FIG. 3.

FIG. 4 is a plan view illustrating an active layer of the display device 1000 in FIG. 3. FIG. 5 is a plan view illustrating a first gate layer of the display device 1000 in FIG. 3. FIG. 6 is a plan view illustrating a second gate layer of the display device 1000 in FIG. 3. FIG. 7 is a plan view illustrating a conductive layer of the display device 1000 in FIG. 3. FIG. 8 is a cross-sectional view illustrating the display device 1000 taken along line I-I' in FIG. 3.

Referring to FIGS. 3, 4, 5, 6, 7, and 8, the display device 1000 may include a substrate 100, a buffer layer 101, an active layer 110, and a first gate insulation layer 102, a first gate layer 120, a second gate insulation layer 103, a second gate layer 130, an insulation interlayer 104, a conductive layer 140, a planarization layer 105, a first electrode 150, a pixel defining layer 106, an emission layer 160, a second electrode 170, and an encapsulation layer 180.

The substrate 100 may be formed of or include a transparent or opaque material. For example, the substrate 100 may include a quartz substrate, a synthetic quartz substrate, a calcium fluoride substrate, a fluorine-doped quartz substrate, a sodalime glass substrate, a non-alkali substrate, or the like. Alternatively, the substrate 100 may include a flexible transparent resin substrate. For example, the transparent resin substrate may be a polyimide substrate.

The buffer layer 101 may be disposed on the substrate 100. The buffer layer 101 may prevent metal atoms or impurities from being diffused from the substrate 100 to the active layer 110. Further, the buffer layer 101 may control a heat transfer rate in a crystallization process for forming the active layer 110 so that a substantially uniform active layer 110 may be obtained.

The active layer 110 may be disposed on the buffer layer 101. In an embodiment, the active layer 110 may include polycrystalline silicon. In another embodiment, the active layer 110 may include an oxide semiconductor. For example, the oxide semiconductor may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). In an embodiment, a portion of the active layer 110 may include the polycrystalline silicon, and another portion of the active layer 110 may include the oxide semiconductor.

The active layer 110 (See FIG. 4) may include a plurality of active patterns ACT, and the active patterns ACT may be disposed to correspond to the pixel circuits PXC, respectively. For example, the active patterns ACT may include first to third active patterns ACT1, ACT2, and ACT3, and the first to third active patterns ACT1, ACT2, and ACT3 may be disposed to correspond to the first to third pixel circuits PXC1, PXC2, and PXC3, respectively.

The active patterns ACT corresponding to one pixel circuit row PR may be connected to each other. For example, the first active pattern ACT1 and the second active pattern ACT2 disposed in the N-th pixel circuit row PR may be connected to each other.

In an embodiment, the active patterns ACT corresponding to one pixel circuit column PC may be separated from each other. For example, the first active pattern ACT1 and the third active pattern ACT3 disposed in the M-th pixel circuit column PC may be separated from each other (i.e., may not be directly connected to each other).

Each of the active patterns ACT may include active regions. Each of the active regions may include a channel region, and a source region and a drain region spaced apart from each other with the channel region interposed therebetween. Specifically, the active patterns ACT for each pixel Px may include a driving active region, a switching active region, a compensation active region, a driving initialization active region AA4, a first emission control active region, a second emission control active region, and a first diode initialization active region AA7-1 and a second diode initialization active region AA7-2.

The driving active region may include a driving channel region CA1, and a driving source region and a driving drain region spaced apart from each other with the driving channel region CA1 interposed therebetween. The switching active region may include a switching channel region CA2, and a switching source region and a switching drain region spaced apart from each other with the switching channel region CA2 interposed therebetween. The compensation active region may include a compensation channel region CA3, and a compensation source region and a compensation drain region spaced apart from each other with the compensation channel region CA3 interposed therebetween. The driving initialization active region AA4 may include a driving initialization channel region CA4, and a driving initialization source region SA4 and a driving initialization drain region DA4 spaced apart from each other with the driving initialization channel region CA4 interposed therebetween. The first emission control active region may include a first emission control channel region CA5, and a first emission control source region and a first emission control drain region spaced apart from each other with the first emission control channel region CA5 interposed therebetween. The second emission control active region may include a second emission control channel region CA6, and a second emission control source region SA6 and a second emission control drain region DA6 spaced apart from each other with the second emission control channel region CA6 interposed therebetween. The first diode initialization active region AA7-1 may include a first diode initialization channel region CA7-1, and a first diode initialization source region SA7-1 and a first diode initialization drain region DA7-1 spaced apart from each other with the first diode initialization channel region CA7-1 interposed therebetween. The second diode initialization active region AA7-2 may include a second diode initialization channel region CA7-2, and a second diode initialization source region SA7-2 and a second diode initialization drain region DA7-2 spaced apart from each other with the second diode initialization channel region CA7-2 interposed therebetween.

In an embodiment, for example, the first diode initialization source region SA7-1 may be positioned on a first end of the first diode initialization active region AA7-1, and the first diode initialization drain region DA7-1 may be positioned on a second end of the first diode initialization active region AA7-1. The second end of the first diode initialization active region AA7-1 may be opposite to the first end of the first diode initialization active region AA7-1. The first diode initialization source region SA7-1 may be opposite to the first diode initialization drain region DA7-1. Further, the second diode initialization source region SA7-2 may be positioned on a first end of the second diode initialization active region AA7-2, and the second diode initialization drain region DA7-2 may be positioned on a second end of the second diode initialization active region AA7-2. The second end of the second diode initialization active region AA7-2 may be opposite to the first end of the first diode initialization active region AA7-2. The second diode initialization source region SA7-2 may be opposite to the second diode initialization drain region DA7-2.

In an embodiment, the first diode initialization active region AA7-1 and the second diode initialization active region AA7-2 of the active pattern in the N-th pixel circuit row PR and the M-th pixel circuit column PC may be disposed with the driving initialization active region AA4 of the active pattern in the (N+1)-th pixel circuit row PR and the M-th pixel circuit column PC interposed therebetween in a plan view. Specifically, the driving initialization channel region CA4 of the active pattern in the (N+1)-th pixel circuit row PR and the M-th pixel circuit column PC may be disposed between the first diode initialization channel region CA7-1 and the second diode initialization channel region CA7-2 of the active pattern in the N-th pixel circuit row PR and the M-th pixel circuit column PC in a plan view.

In an embodiment, the driving initialization active region AA4 of the active pattern in the (N+1)-th pixel circuit row PR and the M-th pixel circuit column PC may be disposed in the first direction DR1 from the first diode initialization active region AA7-1 of the active pattern in the N-th pixel circuit row PR and the M-th pixel circuit column PC, and the second diode initialization active region AA7-2 of the active pattern in the N-th pixel circuit row PR and the M-th pixel circuit column PC may be disposed in the first direction DR1 from the driving initialization active region AA4 of the active pattern in the (N+1)-th pixel circuit row PR and the M-th pixel circuit column PC. Specifically, the driving initialization channel region CA4 of the active pattern in the (N+1)-th pixel circuit row PR and the M-th pixel circuit column PC may be disposed in the first direction DR1 from the first diode initialization channel region CA7-1 of the active pattern in the N-th pixel circuit row PR and the M-th pixel circuit column PC, and the second diode initialization channel region CA7-2 of the active pattern in the N-th pixel circuit row PR and the M-th pixel circuit column PC may be disposed in the first direction DR1 from the driving initialization channel region CA4 of the active pattern in the (N+1)-th pixel circuit row PR and the M-th pixel circuit column PC.

In an embodiment, for example, the first diode initialization active region AA7-1 and the second diode initialization active region AA7-2 of the first active pattern ACT1 may be disposed with the driving initialization active region AA4 of the third active pattern ACT3 interposed therebetween in a plan view. Further, the driving initialization active region AA4 of the third active pattern ACT3 may be disposed in the first direction DR1 from the first diode initialization active region AA7-1 of the first active pattern ACT1, and the second diode initialization active region AA7-2 of the first active pattern ACT1 may be disposed in the first direction DR1 from the driving initialization active region AA4 of the third active pattern ACT3.

In an embodiment, the first diode initialization active region AA7-1 of the active pattern in the N-th pixel circuit row PR and the (M+1)-th pixel circuit column PC may be disposed in the first direction DR1 from the second diode initialization active region AA7-2 of the active pattern in the N-th pixel circuit row PR and the M-th pixel circuit column PC. For example, the first diode initialization active region AA7-1 of the second active pattern ACT2 may be disposed in the first direction DR1 from the second diode initialization active region AA7-2 of the first active pattern ACT1.

In an embodiment, the first diode initialization drain region DA7-1 and the second diode initialization drain region DA7-2 of each of the active patterns ACT may be connected to each other. For example, the first diode initialization drain region DA7-1 and the second diode initialization drain region DA7-2 of the first active pattern ACT1 may extend commonly from the second emission control channel region CA6, and may be connected to each other.

In an embodiment, the second diode initialization source region SA7-2 of the active pattern in the N-th pixel circuit row PR and the M-th pixel circuit column PC and the first diode initialization source region SA7-1 of the active pattern in the N-th pixel circuit row PR and the (M+1)-th pixel circuit column PC may be connected to each other. For example, the second diode initialization source region SA7-2 of the first active pattern ACT1 and the first diode initialization source region SA7-1 of the second active pattern ACT2 may be connected to each other.

The first gate insulation layer 102 may be disposed on the active layer 110. The first gate insulation layer 102 may cover the active layer 110 on the buffer layer 101, and may have substantially the same thickness along the profile of the active layer 110. The first gate insulation layer 102 may include a silicon compound, a metal oxide, or the like.

The first gate layer 120 may be disposed on the first gate insulation layer 102. The first gate layer 120 may include a plurality of scan lines 121, a plurality of first initialization control lines 122, a plurality of emission control lines 123, a plurality of second initialization control lines 124, and a plurality of first storage electrodes 125. Each of the scan lines 121, the first initialization control lines 122, the emission control lines 123, the second initialization control lines 124, and the first storage electrodes 125 may be disposed to correspond to one pixel circuit row PR. The first gate layer 120 may be formed of or include a metal, an alloy, a metal nitride, a conductive metal oxide, a transparent conductive material, or the like.

The scan line 121 may extend in the first direction DR1. The scan signal GW in FIG. 2 may be applied to the scan line 121. The scan line 121 may overlap the switching channel region CA2 and the compensation channel region CA3 of the active pattern in a plan view. The switching active region may form the second transistor T2 together with the scan line 121, and the compensation active region may form the third transistor T3-1 and T3-2 together with the scan line 121.

The first initialization control line 122 may extend in the first direction DR1. The first initialization control signal GI in FIG. 2 may be applied to the first initialization control line 122. For example, an initialization control signal applied to the first initialization control line 122 in the (N+1)-th pixel circuit row PR may be the first initialization control signal GI in the (N+1)-th pixel circuit row PR and the second initialization control signal GB in the N-th pixel circuit row PR.

The first initialization control line 122 in the (N+1)-th pixel circuit row PR may overlap the driving initialization channel region CA4 of the active pattern in the (N+1)-th pixel circuit row PR and the M-th pixel circuit column PC and the first and second diode initialization channel regions CA7-1 and CA7-2 of the active pattern in the N-th pixel circuit row PR and the M-th pixel circuit column PC in a plan view. For example, the first initialization control line 122 connected to the first pixel circuit PXC1 may overlap the driving initialization channel region CA4 of the third active pattern ACT3 and the first and second diode initialization channel regions CA7-1 and CA7-2 of the first active pattern ACT1. The driving initialization active region AA4 may form the fourth transistor T4-1 and T4-2 together with the first initialization control line 122.

The emission control line 123 may extend in the first direction DR1. The emission control signal EM in FIG. 2 may be applied to the emission control line 123. The emission control line 123 may overlap the first emission control channel region CA5 and the second emission control channel region CA6 of the active pattern ACT in a plan view. The first emission active region may form the fifth transistor T5 together with the emission control line 123, and the second emission active region may form the sixth transistor T6 together with the emission control line 123.

The second initialization control line 124 may extend in the first direction DR1. The second initialization control signal GB in FIG. 2 may be applied to the second initialization control line 124. For example, an initialization control signal applied to the second initialization control line 124 in the (N+1)-th pixel circuit row PR may be the second initialization control signal GB in the (N+1)-th pixel circuit row PR and the first initialization control signal GI in an (N+2)-th pixel circuit row PR.

The second initialization control line 124 in the (N+1)-th pixel circuit row PR may overlap the first and second diode initialization channel regions CA7-1 and CA7-2 of the active pattern in the (N+1)-th pixel circuit row PR and the M-th pixel circuit column PC in a plan view. For example, the second initialization control line 124 connected to the third pixel circuit PXC3 may overlap the first and second diode initialization channel regions CA7-1 and CA7-2 of the third active pattern ACT3. The first diode initialization active region AA7-1 may form the first diode initialization transistor T7-1 together with the second initialization control line 124, and the second diode initialization active region AA7-2 may form the second diode initialization transistor T7-2 together with the second initialization control line 124.

The first storage electrode 125 may be disposed between the scan line 121 and the emission control line 123. The first storage electrode 125 may overlap the driving channel region CA1 of the active pattern in a plan view. The driving active region may form the first transistor T1 together with the first storage electrode 125.

The second gate insulation layer 103 may be disposed on the first gate layer 120. The second gate insulation layer 103 may cover the first gate layer 120 on the first gate insulation layer 102, and may have substantially the same thickness along the profile of the first gate layer 120. The second gate insulation layer 103 may include a silicon compound, a metal oxide, or the like.

The second gate layer 130 may be disposed on the second gate insulation layer 103. The second gate layer 130 may include a plurality of horizontal driving initialization voltage lines 131 and 134, a plurality of horizontal diode initialization voltage lines 132 and 135, and a plurality of second storage electrodes 133. Each of the horizontal driving initialization voltage lines 131 and 134, the horizontal diode initialization voltage lines 132 and 135, and the second storage electrodes 133 may be disposed to correspond to pixel circuit rows PR, respectively. For example, the horizontal diode initialization voltage line 132 may be disposed to correspond to the N-th pixel circuit row PR, the horizontal driving initialization voltage line 131 and the horizontal diode initialization voltage line 135 may be disposed to correspond to the (N+1)-th pixel circuit row PR, and the horizontal driving initialization voltage line 134 may be disposed to correspond to the (N+2)-th pixel circuit row PR. The second gate layer 130 may be formed of or include a metal, an alloy, a metal nitride, a conductive metal oxide, a transparent conductive material, or the like.

The horizontal driving initialization voltage lines 131 and 134 may extend in the first direction DR1. The driving initialization voltage VINT1 in FIG. 2 may be applied to the horizontal driving initialization voltage lines 131 and 134.

The horizontal diode initialization voltage lines 132 and 135 may extend in the first direction DR1. The diode initialization voltage VINT2 in FIG. 2 may be applied to the horizontal diode initialization voltage lines 132 and 135.

The second storage electrode 133 may extend in the first direction DR1. The second storage electrode 133 may overlap the first storage electrode 125 in a plan view, and may form the storage capacitor CST together with the first storage electrode 125.

The insulation interlayer 104 may be disposed on the second gate layer 130. In an embodiment, the insulation interlayer 104 may sufficiently cover the second gate layer 130 on the second gate insulation layer 103, and may have a substantially flat upper surface without generating a step around the second gate layer 130. In another embodiment, the insulation interlayer 104 may cover the second gate layer 130 on the second gate insulation layer 103, and may have substantially the same thickness along the profile of the second gate layer 130. The insulation interlayer 104 may be formed of or include an organic insulation material or an inorganic insulation material.

The conductive layer 140 may be disposed on the insulation interlayer 104. The conductive layer 140 may include a plurality of data lines 141, a plurality of power voltage lines 142, a plurality of vertical driving initialization voltage lines 143, a plurality of vertical diode initialization voltage lines 144, and a plurality of first connection patterns 145, a plurality of second connection patterns 146, a plurality of third connection patterns 147, and a plurality of fourth connection patterns 148. The data lines 141, the power voltage lines 142, the third connection patterns 147, and the fourth connection patterns 148 may be disposed to correspond to the pixel circuit columns PC, respectively. Each of the vertical driving initialization voltage lines 143 and the second connection patterns 146 may be disposed to correspond to one of odd-numbered pixel circuit columns PC and even-numbered pixel circuit columns PC, and each of the vertical diode initialization voltage lines 144 and the first connection patterns 145 may be disposed to correspond to another one of the odd-numbered pixel circuit columns PC and the even-numbered pixel circuit columns PC. The conductive layer 140 may be formed of or include a metal, an alloy, a metal nitride, a conductive metal oxide, a transparent conductive material, or the like.

The data line 141 may extend in the second direction DR2. The data signal DATA in FIG. 2 may be applied to the data line 141. The data line 141 may be electrically connected to the active layer 110. The data line 141 may directly contact the active layer 110 through a contact hole defined in the insulation interlayer 104, the second gate insulation layer 103, and the first gate insulation layer 102.

The power voltage line 142 may extend in the second direction DR2. The first power voltage ELVDD in FIG. 2 may be applied to the power voltage line 142. The power voltage line 142 may be electrically connected to the active layer 110 and the second storage electrode 133. The power voltage line 142 may directly contact the active layer 110 through a contact hole defined in the insulation interlayer 104, the second gate insulation layer 103, and the first gate insulation layer 102, and may directly contact the second storage electrode 133 through a contact hole defined in the insulation interlayer 104.

The vertical driving initialization voltage line 143 may extend in the second direction DR2. The driving initialization voltage VINT1 may be applied to the vertical driving initialization voltage line 143. The vertical driving initialization voltage line 143 may be electrically connected to the active patterns ACT and the horizontal driving initialization voltage lines 131 and 134. The vertical driving initialization voltage line 143 may directly contact the active patterns ACT in the (M+1)-th pixel circuit column PC through contact holes defined in the insulation interlayer 104, the second gate insulation layer 103, and the first gate insulation layer 102, and may directly contact the horizontal driving initialization voltage line 131 and 134 through a contact hole defined in the insulation interlayer 104. Specifically, the vertical driving initialization voltage line 143 may directly contact the driving initialization source region SA4 of the active pattern in the (M+1)-th pixel circuit column PC. The horizontal driving initialization voltage lines 131 and 134 and the vertical driving initialization voltage lines 143 may form a driving initialization voltage line that transmits the driving initialization voltage VINT1.

The vertical diode initialization voltage line 144 may extend in the second direction DR2. The diode initialization voltage VINT2 may be applied to the vertical diode initialization voltage line 144. The vertical diode initialization voltage line 144 may be electrically connected to the active patterns ACT and the horizontal diode initialization voltage lines 132 and 135. The vertical diode initialization voltage line 144 may directly contact the active patterns ACT in the M-th pixel circuit column PC through contact holes defined in the insulation interlayer 104, the second gate insulation layer 103, and the first gate insulation layer 102, and may directly contact the horizontal diode initialization voltage line 132 and 135 through a contact hole defined in the insulation interlayer 104. Specifically, the vertical diode initialization voltage line 144 may directly contact the second diode initialization source region SA7-2 of the active pattern in the M-th pixel circuit column PC. The horizontal diode initialization voltage lines 132 and 135 and the vertical diode initialization voltage lines 144 may form a diode initialization voltage line that transmits the diode initialization voltage VINT2.

The first connection pattern 145 may directly contact the active pattern in the M-th pixel circuit column PC through a contact hole defined in the insulation interlayer 104, the second gate insulation layer 103, and the first gate insulation layer 102, and may directly contact the horizontal driving initialization voltage line 131 and 134 through a contact hole defined in the insulation interlayer 104. Specifically, the first connection pattern 145 may directly contact the driving initialization source region SA4 of the active pattern in the M-th pixel circuit column PC.

The vertical driving initialization voltage line 143 may directly contact the driving initialization source region SA4 of the active pattern in the (M+1)-th pixel circuit column PC, and the first connection pattern 145 may directly contact the driving initialization source region SA4 of the active pattern in the M-th pixel circuit column PC, so that the driving initialization voltage line may be electrically connected to the driving initialization source region SA4 of each of the active patterns ACT.

The second connection pattern 146 may directly contact the active pattern in the (M+1)-th pixel circuit column PC through a contact hole defined in the insulation interlayer 104, the second gate insulation layer 103, and the first gate insulation layer 102, and may directly contact the horizontal diode initialization voltage line 132 and 135 through a contact hole defined in the insulation interlayer 104. Specifically, the second connection pattern 146 may directly contact the second diode initialization source region SA7-2 of the active pattern in the (M+1)-th pixel circuit column PC.

The vertical diode initialization voltage line 144 may directly contact the second diode initialization source region SA7-2 of the active pattern in the M-th pixel circuit column PC, the second connection pattern 146 may directly contact the second diode initialization source region SA7-2 of the active pattern in the (M+1)-th pixel circuit column PC, and the second diode initialization source region SA7-2 of the active pattern in the M-th pixel circuit column PC may be electrically connected to the first diode initialization source region SA7-1 of the active pattern in the (M+1)-th pixel circuit column PC, so that the diode initialization voltage line may be electrically connected to the first diode initialization source region SA7-1 and the second diode initialization source region SA7-2 of each of the active patterns ACT.

In an embodiment, the second diode initialization source region SA7-2 of the first active pattern ACT1 may contact the vertical diode initialization voltage line 144, and the first diode initialization source region SA7-1 of the first active pattern ACT1 may contact a second connection pattern (not illustrated) that contacts the horizontal diode initialization voltage line 132. Further, the first diode initialization source region SA7-1 of the second active pattern ACT2 may contact the vertical diode initialization voltage line 144, and the second diode initialization source region SA7-2 of the second active pattern ACT2 may contact the second connection pattern 146 that contacts the horizontal diode initialization voltage line 132. Accordingly, the diode initialization voltage VINT2 may be commonly applied to the first and second diode initialization source regions SA7-1 and SA7-2 of the first active pattern ACT1 and the first and second diode initialization source regions SA7-1 and SA7-2 of the second active pattern ACT2.

The third connection pattern 147 may directly contact the active layer 110 through a contact hole defined in the insulation interlayer 104, the second gate insulation layer 103, and the first gate insulation layer 102, and may directly contact the first storage electrode 125 through a contact hole defined in the insulation interlayer 104 and the second gate insulation layer 103.

The fourth connection pattern 148 may directly contact the active layer 110 through a contact hole defined in the insulation interlayer 104, the second gate insulation layer 103, and the first gate insulation layer 102.

The planarization layer 105 may be disposed on the conductive layer 140. The planarization layer 105 may sufficiently cover the conductive layer 140 on the insulation interlayer 104, and may have a substantially flat upper surface without generating a step around the conductive layer 140. The planarization layer 105 may be formed of or include an organic insulation material such as a photoresist, an acrylic resin, a polyimide resin, a polyamide resin, a siloxane-based resin, or the like.

The first electrode 150 may be disposed on the planarization layer 105. The first electrode 150 may directly contact the fourth connection pattern 148 through a contact hole defined in the planarization layer 105. Depending on how the display device 1000 emits light, the first electrode 150 may be formed of or include a reflective material or a transmitting material. For example, the first electrode 150 may include aluminum (Al), an alloy containing aluminum (Al), aluminum nitride (AlN$_x$), silver (Ag), an alloy containing silver (Ag), tungsten (W), tungsten nitride (WN$_x$), copper (Cu), an alloy containing copper (Cu), nickel (Ni), chromium (Cr), chromium nitride (CrN$_x$), molybdenum (Mo), an alloy containing molybdenum (Mo), titanium (Ti), titanium nitride (TiN$_x$), platinum (Pt), tantalum (Ta), tantalum nitride (TaN$_x$), neodymium (Nd), scandium (Sc), zinc oxide (ZnO$_x$), indium tin oxide ("ITO"), tin oxide (SnO$_x$), indium oxide (InO$_x$), gallium oxide (GaO$_x$), indium zinc oxide ("IZO"), or the like. In an embodiment, the first electrode 150 may be formed as a single-layer structure or a multilayer structure including a metal layer, an alloy layer, a metal nitride layer, a conductive metal oxide layer, and/or a transparent conductive oxide layer.

The pixel defining layer 106 may be disposed on the first electrode 150. The pixel defining layer 106 may be formed of or include an organic insulation material, an inorganic insulation material, or the like. For example, the pixel defining layer 106 may be formed of or include a photoresist, a polyacrylic resin, a polyimide resin, an acrylic resin, a silicone compound, or the like. In an embodiment, the pixel defining layer 106 may define an opening partially exposing the first electrode 150. An emission area and a non-emission area of the display device 1000 may be defined by the opening of the pixel defining layer 106. For example, the emission area may correspond to a portion of the pixel defining layer 106 in which the opening is positioned, and the non-emission area may correspond to a portion of the pixel defining layer 106 adjacent to the opening.

The emission layer 160 may be disposed on the first electrode 150 exposed through the opening of the pixel defining layer 106. Further, the emission layer 160 may extend on a sidewall of the opening of the pixel defining layer 106. In an embodiment, the emission layer 160 may have a multilayer structure including an organic emission layer, a hole injection layer, a hole transport layer, an electron transport layer, an electron injection layer, of the like.

The second electrode 170 may be disposed on the pixel defining layer 106 and the emission layer 160. Depending on how the display device 1000 emits light, the second electrode 170 may be formed of or include a transmitting material or a reflective material. For example, the second electrode 170 may include aluminum (Al), an alloy containing aluminum (Al), aluminum nitride (AlN$_x$), silver (Ag), an alloy containing silver (Ag), tungsten (W), tungsten nitride (WN$_x$), copper (Cu), an alloy containing copper (Cu), nickel (Ni), chromium (Cr), chromium nitride (CrN$_x$), molybdenum (Mo), an alloy containing molybdenum (Mo), titanium (Ti), titanium nitride (TiN$_x$), platinum (Pt), tantalum (Ta), tantalum nitride (TaN$_x$), neodymium (Nd), scandium (Sc), zinc oxide (ZnO$_x$), indium tin oxide (ITO), tin oxide (SnO$_x$), indium oxide (InO$_x$), gallium oxide (GaO$_x$), indium zinc oxide (IZO), or the like. In an embodiment, the second electrode 170 may be formed as a single-layer structure or a multilayer structure including a metal layer, an alloy layer, a metal nitride layer, a conductive metal oxide layer, and/or a transparent conductive oxide layer.

The first electrode 150, the emission layer 160, and the second electrode 170 may form the light emitting diode LD. In an embodiment, the first electrode 150 may be an anode electrode of the light emitting diode LD, and the second electrode 170 may be a cathode electrode of the light emitting diode LD.

The encapsulation layer 180 may be disposed on the second electrode 170. The encapsulation layer 180 may prevent penetration of external moisture and oxygen. The encapsulation layer 180 may include at least one inorganic encapsulation layer and at least one organic encapsulation layer. At least one inorganic encapsulation layer and at least one organic encapsulation layer may be alternately stacked with each other.

In an embodiment, the encapsulation layer 180 may include a first inorganic encapsulation layer, an organic encapsulation layer, and a second inorganic encapsulation layer. The first inorganic encapsulation layer, the organic encapsulation layer, and the second inorganic encapsulation layer may be sequentially stacked on the second electrode 170.

In the present invention, elements of the encapsulation layer 180 according to the invention are not limited to the above-described embodiment, and in another embodiment, the encapsulation layer 180 may include another element capable of protecting the light emitting diode LD. For example, the encapsulation layer 180 may be formed as a substrate type including glass or plastic to protect the light emitting diode LD.

In the display device according to the embodiments, the active patterns ACT disposed in one pixel circuit row PR (e.g., the first active pattern ACT1 and the second active pattern ACT2 disposed in the M-th pixel circuit row PR) may be connected to each other, so that static electricity may be dispersed and the active patterns ACT may not be damaged although the static electricity is introduced in the process of manufacturing or using the display device 1000. Accordingly, a display quality of the display device may be improved.

Figure 9:
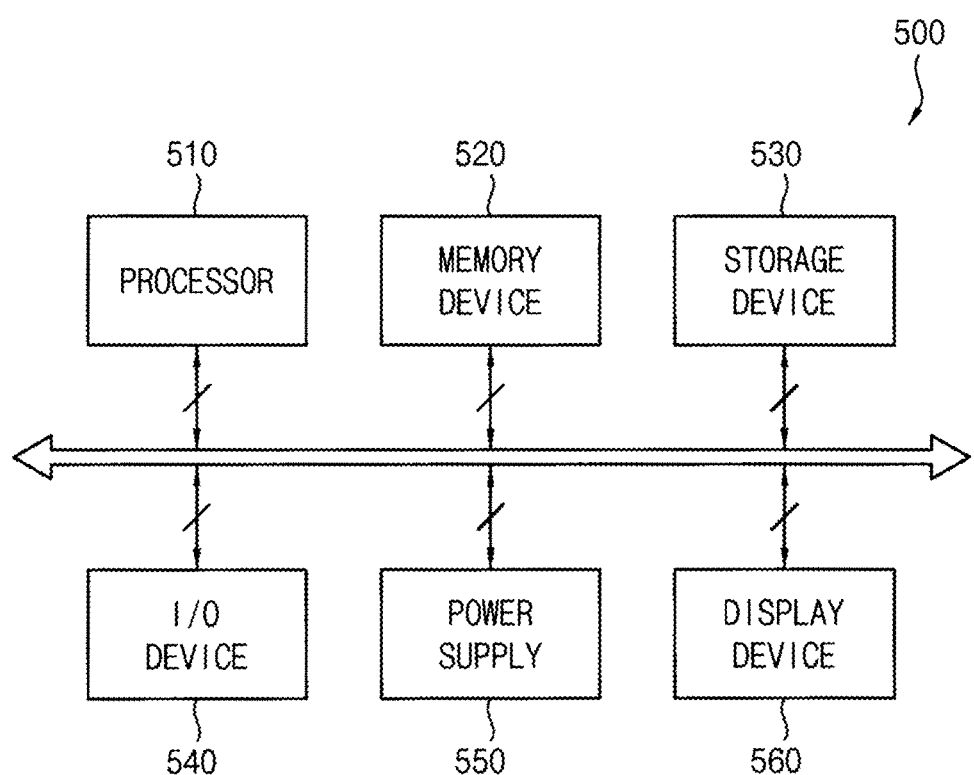
FIG. 9 is a block diagram illustrating an electronic device according to an embodiment.
Figure 10:
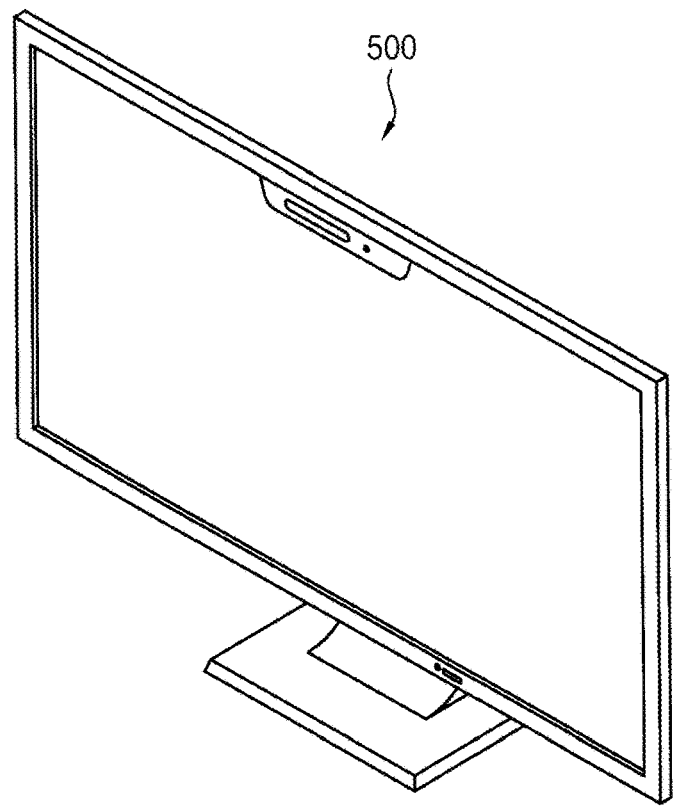
FIG. 10 is a diagram illustrating an example in which the electronic device in FIG. 9 is implemented as a television.
Figure 11:
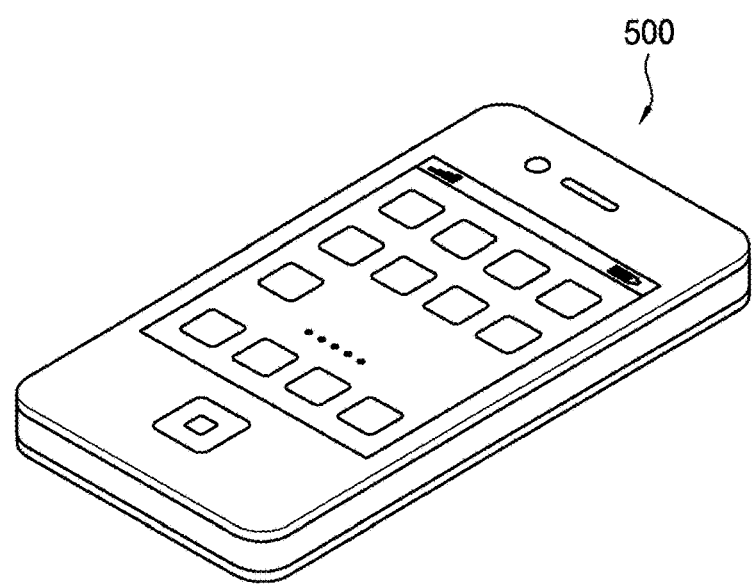
FIG. 11 is a diagram illustrating an example in which the electronic device in FIG. 9 is implemented as a smart phone.

FIG. 9 is a block diagram illustrating an electronic device according to an embodiment. FIG. 10 is a diagram illustrating an example in which the electronic device in FIG. 9 is implemented as a television. FIG. 11 is a diagram illustrating an example in which the electronic device in FIG. 9 is implemented as a smart phone.

Referring to FIGS. 9, 10, and 11, an electronic device 500 may include a processor 510, a memory device 520, a storage device 530, an input/output ("I/O") device 540, a power supply 550, and a display device 560. Here, the display device 560 may correspond to the display device 1000 described with reference to FIGS. 1 to 8. The electronic device 500 may further include a plurality of ports for communicating with a video card, a sound card, a memory card, a universal serial bus ("USB") device, etc. In an embodiment, as illustrated in FIG. 10, the electronic device 500 may be implemented as a television. In another embodiment, as illustrated in FIG. 11, the electronic device 500 may be implemented as a smart phone. However, the electronic device 500 according to the invention is not limited thereto. In another embodiment, the electronic device 500 may be implemented as a cellular phone, a video phone, a smart pad, a smart watch, a tablet personal computer ("PC"), a car navigation system, a computer monitor, a laptop, a head disposed (e.g., mounted) display ("HMD"), etc., for example.

The processor 510 may perform various computing functions. In an embodiment, the processor 510 may be a microprocessor, a central processing unit ("CPU"), an application processor ("AP"), etc., for example. In an embodiment, the processor 510 may be coupled to other components via an address bus, a control bus, a data bus, etc., for example. Further, the processor 510 may be coupled to an extended bus such as a peripheral component interconnection ("PCI") bus.

The memory device 520 may store data for operations of the electronic device 500. In an embodiment, the memory device 520 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example.

In an embodiment, the storage device 530 may include a solid state drive ("SSD") device, a hard disk drive ("HDD") device, a CD-ROM device, etc., for example. In an embodiment, the I/O device 540 may include an input device such as a keyboard, a keypad, a mouse device, a touchpad, a touch-screen, etc., and an output device such as a printer, a speaker, etc.

The power supply 550 may provide power for operations of the electronic device 500. The display device 560 may be coupled to other components via the buses or other communication links. In an embodiment, the display device 560 may be included in the I/O device 540.

The display device according to the embodiments may be applied to a display device included in a computer, a notebook, a mobile phone, a smart phone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
   a plurality of pixel circuits defining a plurality of pixel circuit rows each extending in a first direction and a plurality of pixel circuit columns each extending in a second direction crossing the first direction;
   a plurality of active patterns disposed to correspond to the plurality of pixel circuits, respectively;
   a horizontal diode initialization voltage line which transmits a diode initialization voltage and extends in the first direction; and
   a vertical diode initialization voltage line extending in the second direction and connected to the horizontal diode initialization voltage line,
   wherein each of the plurality of active patterns includes first and second diode initialization active regions to which the diode initialization voltage is applied,
   wherein first active patterns of the plurality of active patterns corresponding to one of the plurality of pixel circuit rows are connected to each other, and
   wherein a first end of one of the first and second diode initialization active regions contacts the vertical diode initialization voltage line.

2. The display device of claim 1, wherein a first end of another one of the first and second diode initialization active regions contacts a connection pattern contacting the horizontal diode initialization voltage line.

3. The display device of claim 2, wherein a second end of the first diode initialization active region and a second end of the second diode initialization active region are connected to an anode electrode of a light emitting diode.

4. The display device of claim 1, wherein second active patterns of the plurality of active patterns corresponding to one of the plurality of pixel circuit columns are separated from each other.

5. The display device of claim 1, wherein a first end of a second diode initialization active region of an active pattern in an M-th pixel circuit column contacts the vertical diode initialization voltage line, where M is a natural number, and wherein a first end of a first diode initialization active region of the active pattern in the M-th pixel circuit column contacts a first connection pattern contacting the horizontal diode initialization voltage line.

6. The display device of claim 5, wherein a first end of a first diode initialization active region of an active pattern in an (M+1)-th pixel circuit column contacts the vertical diode initialization voltage line.

7. The display device of claim 6, wherein a first end of a second diode initialization active region of the active pattern in the (M+1)-th pixel circuit column contacts a second connection pattern contacting the horizontal diode initialization voltage line.

8. The display device of claim 1, wherein each of the plurality of active patterns further includes a driving initialization active region to which a driving initialization voltage is applied, and
wherein a first diode initialization active region and a second diode initialization active region of an active pattern in an N-th pixel circuit row and an M-th pixel circuit column are disposed with a driving initialization active region of an active pattern in an (N+1)-th pixel circuit row and the M-th pixel circuit column interposed therebetween in a plan view, where M and N are natural numbers.

9. The display device of claim 8, further comprising a plurality of initialization control lines each extending in the first direction and disposed to correspond to a corresponding pixel circuit row of the plurality of pixel circuit rows,
wherein an initialization control line in the (N+1)-th pixel row overlaps the driving initialization active region of the active pattern in the (N+1)-th pixel circuit row and the M-th pixel circuit column and the first and second diode initialization active regions of the active pattern in the N-th pixel circuit row and the M-th pixel circuit column in the plan view.

10. The display device of claim 8, wherein the driving initialization active region of the active pattern in the (N+1)-th pixel circuit row and the M-th pixel circuit column is disposed in the first direction from the first diode initialization active region of the active pattern in the N-th pixel circuit row and the M-th pixel circuit column, and
wherein the second diode initialization active region of the active pattern in the N-th pixel circuit row and the M-th pixel circuit column is disposed in the first direction from the driving initialization active region of the active pattern in the (N+1)-th pixel circuit row and the M-th pixel circuit column.

11. A display device, comprising:
a first pixel circuit;
a second pixel circuit disposed in a first direction from the first pixel circuit;
a third pixel circuit disposed in a second direction from the first pixel circuit, wherein the second direction crosses the first direction;
first to third active patterns disposed to correspond to the first to third pixel circuits, respectively;
a horizontal diode initialization voltage line which transmits a diode initialization voltage and extends in the first direction; and
a vertical diode initialization voltage line extending in the second direction and connected to the horizontal diode initialization voltage line,
wherein each of the first to third active patterns includes first and second diode initialization active regions to which the diode initialization voltage is applied,
wherein the first active pattern and the second active pattern are connected to each other, and
wherein a first end of one of the first and second diode initialization active regions contacts the vertical diode initialization voltage line.

12. The display device of claim 11, wherein a first end of another one of the first and second diode initialization active regions contacts a connection pattern contacting the horizontal diode initialization voltage line.

13. The display device of claim 12, wherein a second end of the first diode initialization active region and a second end of the second diode initialization active region are connected to an anode electrode of a light emitting diode.

14. The display device of claim 11, wherein the first active pattern and the third active pattern are separated from each other.

15. The display device of claim 11, wherein a first end of the second diode initialization active region of the first active pattern contacts the vertical diode initialization voltage line, and
wherein a first end of the first diode initialization active region of the first active pattern contacts a first connection pattern contacting the horizontal diode initialization voltage line.

16. The display device of claim 15, wherein a first end of the first diode initialization active region of the second active pattern contacts the vertical diode initialization voltage line.

17. The display device of claim 16, wherein a first end of the second diode initialization active region of the second active pattern contacts a second connection pattern contacting the horizontal diode initialization voltage line.

18. The display device of claim 11, wherein each of the first to third active patterns further includes a driving initialization active region to which a driving initialization voltage is applied, and
wherein the first diode initialization active region and the second diode initialization active region of the first active pattern are disposed with the driving initialization active region of the third active pattern interposed therebetween in a plan view.

19. A display device, comprising:
a first pixel circuit;
a second pixel circuit disposed in a first direction from the first pixel circuit; and
a third pixel circuit disposed in a second direction from the first pixel circuit, wherein the second direction crosses the first direction,
wherein each of the first to third pixel circuits includes:
an active pattern including a driving initialization active region to which a driving initialization voltage is applied and first and second diode initialization active regions to which a diode initialization voltage different from the driving initialization voltage is applied; and
an initialization control line disposed on the active pattern and extending in the first direction, and
wherein the first diode initialization active region and the second diode initialization active region of the active pattern of the first pixel circuit are disposed with the driving initialization active region of the active pattern of the third pixel circuit interposed therebetween in a plan view.

20. The display device of claim 19, wherein the driving initialization active region of the active pattern forms a driving initialization transistor together with the initialization control line, wherein the first diode initialization active region of the active pattern forms a first diode initialization transistor together with the initialization control line, and wherein the second diode initialization active region of the active pattern forms a second diode initialization transistor together with the initialization control line.

21. The display device of claim 20, wherein each of the first to third pixel circuits further includes a driving transistor which provides a driving current to a light emitting diode, and wherein the driving initialization transistor provides the driving initialization voltage to the driving transistor.

22. The display device of claim 21, wherein each of the first diode initialization transistor and the second diode initialization transistor provides the diode initialization voltage to the light emitting diode.

* * * * *